(12) United States Patent
Tanibuchi

(10) Patent No.: US 10,100,401 B2
(45) Date of Patent: Oct. 16, 2018

(54) CUTTING INSERT MANUFACTURING METHOD

(71) Applicant: KYOCERA Corporation, Kyoto-shi, Kyoto (JP)

(72) Inventor: Takahito Tanibuchi, Satsumasendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/312,006

(22) PCT Filed: May 25, 2015

(86) PCT No.: PCT/JP2015/064922
§ 371 (c)(1),
(2) Date: Nov. 17, 2016

(87) PCT Pub. No.: WO2015/182552
PCT Pub. Date: Dec. 3, 2015

(65) Prior Publication Data
US 2017/0073808 A1    Mar. 16, 2017

(30) Foreign Application Priority Data

May 28, 2014 (JP) ................................ 2014-110312

(51) Int. Cl.
*C23C 16/00* (2006.01)
*C23C 16/04* (2006.01)
(Continued)

(52) U.S. Cl.
CPC ............ *C23C 16/045* (2013.01); *B23B 27/14* (2013.01); *C23C 16/458* (2013.01); *B23B 2228/04* (2013.01)

(58) Field of Classification Search
CPC .. C23C 16/045; C23C 16/458; B23B 2228/04
See application file for complete search history.

(56) References Cited

U.S. PATENT DOCUMENTS

| 5,576,058 A | * | 11/1996 | Norrgrann | ............ C23C 16/458 118/500 |
| 6,939,131 B2 | * | 9/2005 | Maumus | ............... C21D 9/0025 248/346.01 |
| 2005/0132957 A1 | * | 6/2005 | El-Raghy | ............ C23C 16/4581 118/500 |

FOREIGN PATENT DOCUMENTS

| JP | 09-510507 A | 10/1997 |
| JP | 2007-518878 A | 7/2007 |

OTHER PUBLICATIONS

International Search Report (Form PCT/ISA/210) issued for PCT/JP2015/064922, dated Aug. 25, 2015.
(Continued)

*Primary Examiner* — Kelly M Gambetta
(74) *Attorney, Agent, or Firm* — Volpe and Koenig, P.C.

(57) ABSTRACT

A method for manufacturing a cutting insert includes preparing a base body provided with a through hole and including one of cermet and ceramic, mounting the base body on a holding member by passing the through hole of the base body over a projection including metal and formed on the holding member, and abutting the base body against the projection, forming a coated body by forming a coating layer on the surface of the base body, and cooling the coated body and removing the coated body from the projection.

16 Claims, 2 Drawing Sheets

(51) Int. Cl.
*B23B 27/14* (2006.01)
*C23C 16/458* (2006.01)

(56) References Cited

OTHER PUBLICATIONS

Written Opinion (Form PCT/ISA/237) issued for PCT/JP2015/064922, dated Aug. 25, 2015.

* cited by examiner

CUTTING INSERT MANUFACTURING METHOD

TECHNICAL FIELD

The present invention relates to a method for manufacturing a cutting insert with a coating layer formed on a surface of a base body.

BACKGROUND

Conventionally, a cutting insert (hereinafter sometimes abbreviated to "insert") is known in which a coating layer including a single layer or a plurality of layers is formed on the surface of a base body made of a hard metal alloy, such as cemented carbide alloy or cermet, or of ceramic and the like, using a thin film forming method, such as a CVD method.

When forming the coating layer on the insert using the CVD method, several thousands of the inserts are set inside a film forming device, and film formation can be performed simultaneously, thus enabling efficient film formation. As a method for setting the inserts, conventionally, a general method involves providing opening portions for placing each of the inserts on a support substrate on which the inserts are set, placing the inserts in a state of being diagonally inserted into the opening portions, and performing film formation. In this method, the coating layer is not formed on a contact portion between the support substrate and the insert, and remains as contact traces. Since the contact traces are formed on an edge portion of the insert, when these contact traces are present on a cutting edge, wear resistance deteriorates partially at the contact traces, and becomes a cause of property variations.

Here, for example, in Patent Document 1, a method is proposed in which a peg, which is made from a ceramic material, reinforced graphite, or a molybdenum cemented carbide alloy and which is provided with a leg and a shoulder, is fitted into a support substrate, the peg is inserted into a through hole for inserting a screw of an insert, and a wall surface of an end portion of a through hole in the insert is caused to be in contact with the shoulder of the peg and is fixed.

CITATION LIST

Patent Literature

Patent Document 1: Japanese Unexamined Patent Application Publication (Translation of PCT Application) No. H9-510507A1

SUMMARY OF INVENTION

Technical Problem

In the film formation method for the insert disclosed in the above-described Patent Document 1, contact traces are not formed on the edge portion of the insert and thus, cutting traces are not present on the cutting edge. However, in the method of Patent Document 1, when forming a coating layer, the coating layer is also formed in the vicinity of a contact point between the peg and the insert, and sometimes the peg and the insert become stuck firmly together and the insert is difficult to remove.

Solution to Problem

A method for manufacturing a cutting insert includes: preparing a base body provided with a through hole and includes one of cermet and ceramic, and a holding member including a projection thereon, the projection including metal; mounting the base body on the holding member by inserting the projection of the holding member into the through hole of the base body and abutting the base body against the projection; forming a coating layer on a surface of the base body; and cooling the base body including the coating layer formed thereon and removing the base body from the projection.

Advantageous Effects of Invention

According to the present embodiment, because the projection includes metal, the projection has a thermal expansion coefficient greater than that of the base body. Therefore, when cooling the interior of a film forming device after the film formation is complete, the contraction of the projection is greater than the contraction of the through hole of the base body, and after cooling, the projection and the through hole of the base body can be inhibited from becoming firmly stuck together. As a result, the cutting insert can be easily removed from the holding member.

DESCRIPTION OF EMBODIMENTS

Cutting Insert

Figure 1A:
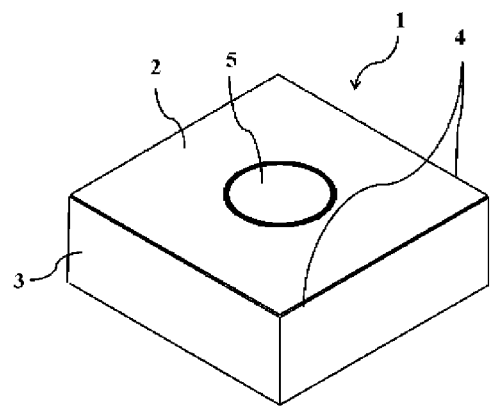
FIG. 1A is a schematic perspective view of an example of a cutting insert produced by a method for manufacturing a cutting tool according to the present embodiment.
Figure 1B:
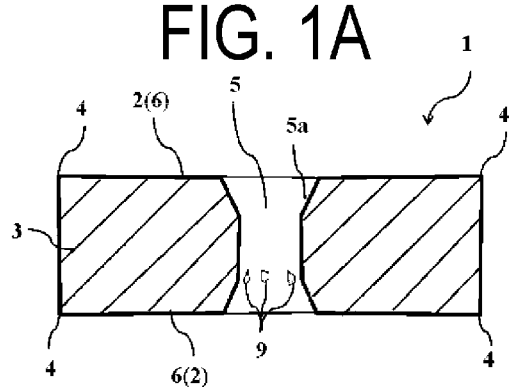
FIG. 1B is a cross-sectional view of the cutting insert in FIG. 1A.

As illustrated in FIGS. 1A and 1B, a cutting insert (hereinafter referred to as "insert") 1 produced by a method for manufacturing a cutting insert of the present embodiment has a plate shape in which one of the main faces serves as a rake face 2, a side face serves as a flank face 3, and a crossing ridge portion formed by the rake face 2 and the flank face 3 serves as a cutting edge 4. Further, a through hole 5 is provided in a center portion of the rake face 2, and the through hole 5 penetrates from the rake face 2 through to a main face on the opposite side, which is a seating face 6. In the present embodiment, both main faces of the insert 1 can be used as the rake face 2. Specifically, after one of the main faces of the insert 1 is used as the rake face 2, the insert 1 can be reversed and the other main face can be used as the rake face. Specifically, the insert 1 is made in a so-called negative chip shape. Thus, the cutting edge 4 is provided on both main faces. In the present embodiment, the insert 1 may also have a so-called positive chip shape in which only one of the main faces is used as the rake face.

Figure 2:
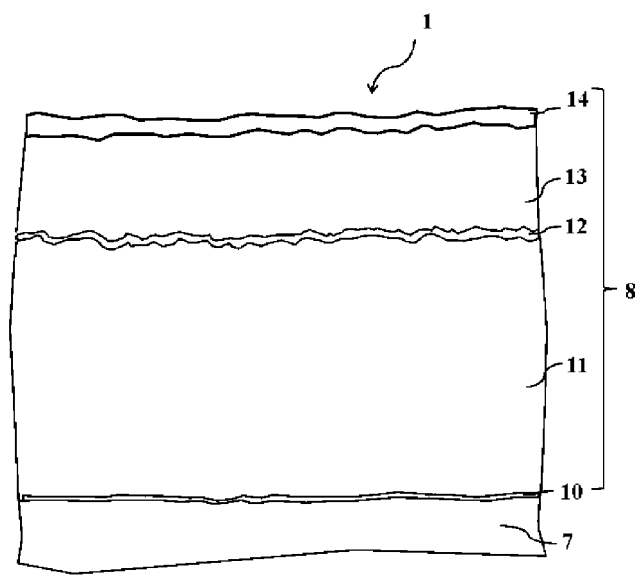
FIG. 2 is a schematic cross-sectional view illustrating a configuration of a coating layer of the cutting insert in FIGS. 1A and 1B.

As illustrated in FIG. 2, the insert 1 includes a base body 7 and a coating layer 8 provided on the surface of this base body 7. In the present embodiment, the base body 7 is made from cermet or ceramic. Specifically, the base body 7 may be cemented carbide alloy or TiCN-based cermet in which a hard phase made from tungsten carbide (WC) or titanium carbonitride (TiCN) and, as desired, at least one type selected from the group consisting of carbides, nitrides, and carbonitrides of a metal of group 4, 5, or 6 of the periodic table is bonded with a bonding phase made from an iron group metal such as cobalt (Co) or nickel (Ni), or it may be a ceramic such as $Si_3N_4$, $Al_2O_3$, diamond, or cubic boron nitride (cBN). Among these, the base body 7 is preferably made from the cemented carbide alloy or the TiCN-based cermet from the point of view of defect resistance and wear resistance.

The coating layer 8 is favorably a film formed by a chemical vapor deposition (CVD) method. In the present embodiment, as illustrated in FIG. 2, the coating layer 8 is formed, in order from the base body 7 side, by layering a titanium nitride layer 10 with a thickness of 0 to 1 μm, a titanium carbonitride layer 11 with a thickness of 5 to 13 μm, a titanium oxycarbonitride layer 12 with a thickness of 0.05 to 0.5 μm, an aluminum oxide layer 13 with a thickness of 1 to 13 μm, and a titanium nitride layer 14 with a thickness of 0 to 3 μm. The coating layer 8 is not limited to the configuration illustrated in FIG. 2.

In the present embodiment, the coating layer 8 is present over all of the rake face 2, the flank face 3, the seating face 6, and the through hole 5, but the present embodiment is not limited thereto, and the rake face 2 and the seating face 6 may not be covered with the coating layer 8 or the coating layer 8 may be removed therefrom, or the coating layer 8 may be removed on the flank face 3, for example.

Cutting Insert Manufacturing Method

The method for manufacturing the cutting insert 1 according to the present embodiment includes a step in which a projection 25 of the holding member 22 is inserted into the through hole 5 provided in the base body 7 and the base body 7 is abutted against the projection 25, a step in which the coating layer 8 is formed on the base body 7, and a step in which the base body 7 including the coating layer 8 formed thereon is removed from the projection 25.

Specifically, first, metal powder, carbon powder, and the like are added as appropriate to inorganic powder such as a metal carbide, nitride, carbonitride, or oxide that can form the cermet or the ceramic forming the base body 7. These are mixed, and then molded into a prescribed tool shape including the through hole 5 by a known molding method such as press molding, cast molding, extrusion molding, or cold isostatic pressing, and then fired, thereby producing the base body 7 made from the above-described cermet or ceramic. Note that the base body 7 may also be made from a composite material, such as a layered body formed from cermet and ceramic. Then, a polishing process and a honing process of the cutting edge portion are implemented as desired on the surface of the above-described base body 7.

Then, the coating layer 8 is formed on the surface of the base body 7 by the chemical vapor deposition (CVD) method. Next, film formation steps will be specifically described.

Figure 3:
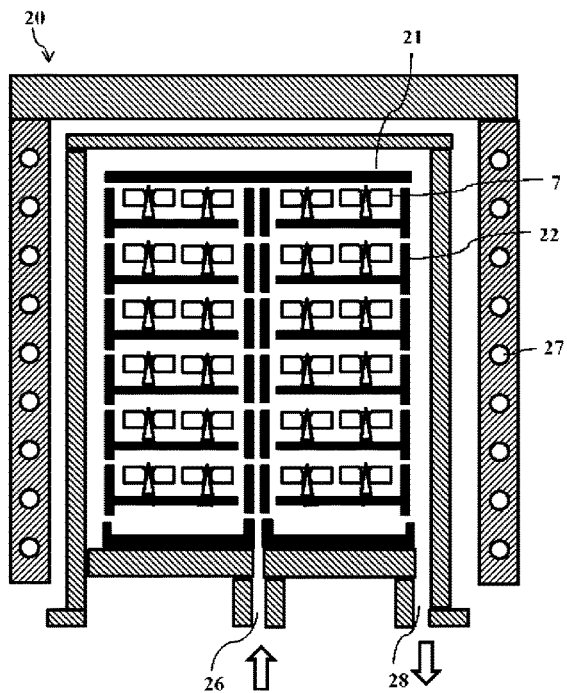
FIG. 3 is an explanatory diagram illustrating a configuration of a film forming device that forms the coating layer, in the method for manufacturing the cutting tool according to the present embodiment.
Figure 4A:
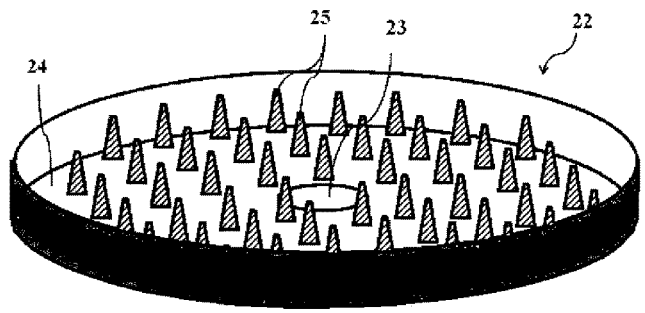
FIG. 4A is a perspective view of a holding member for holding base bodies inside the film forming device in FIG. 3.

First, the projection 25 of the holding member 22 is inserted into the through hole 5 provided in the base body 7, and the base body 7 is abutted against the projection 25. Specifically, as illustrated in FIG. 3, the base bodies 7 are placed in a chamber 21 of a film forming device 20, and the interior of the chamber 21 is sealed. The base bodies 7 are transported into the chamber 21 in a state of being mounted on the holding members 22. As illustrated in FIG. 4A, the projections 25 are provided on the top face of the support substrate 24 of the holding member 22, and the maximum width of the upper portion of the projection 25 is less than the maximum width of the lower portion in a vertical cross-section.

Figures 4B, 4C:
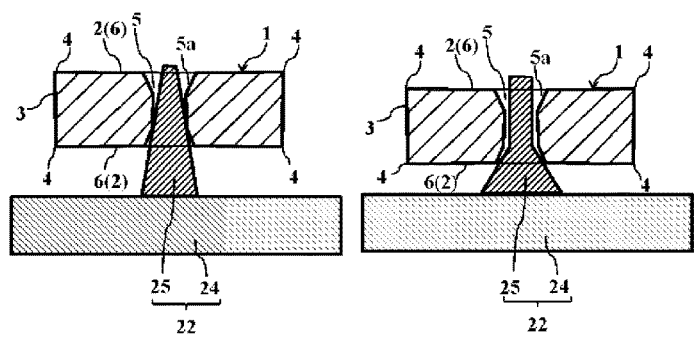
FIG. 4B is a cross-sectional view illustrating a mounted state of the base body on the holding member.
FIG. 4C is a cross-sectional view illustrating a mounted state of the base body on another of the holding members.

The holding member 22 includes the support substrate 24, and the projections 25 are provided on the support substrate 24. As illustrated in FIG. 4A, the holding member 22 has a shape in which many of the projections 25 are aligned on the bottom face of the recessed support substrate 24. The support substrate 24 may also have a flat plate shape. Note that a through hole 23, through which a gas lead-in pipe 26 illustrated in FIG. 3 is passed, is provided in a center portion of the support substrate 24. As illustrated in FIGS. 4B and 4C, the projection 25 of the holding member 22 is inserted into the through hole 5 of the base body 7. That is, the through hole 5 of the base body 7 is passed through the projection 25 of the holding member 22 from above, and the base body 7 is abutted against the projection 25 at a predetermined height of the projection 25. In other words, the base body 7 is held on the holding member 22 by being hooked onto the projection 25.

The projection 25 includes metal. According to the present embodiment, the projection 25 is made from metal. This metal has a thermal expansion coefficient greater than one of the ceramic and cermet that forms the base body 7. In this way, at a film-forming temperature that will be described later, the thermal expansion coefficient of the projection 25 is greater than that of the base body 7, and therefore, the projection 25 presses an inner wall surface 5a of the through hole 5 of the base body 7 and deforms. Then, after the film formation is complete, when the interior of the film forming device 20 is cooled, a thermal contraction coefficient of the projection 25 is high, and thus, the contraction of the projection 25 is greater than the contraction of the inner wall surface 5a of the through hole 5 of the base body 7. As a result, in the cooling process, a gap is easily formed between the projection 25 and the inner wall surface 5a of the through hole 5 of the base body 7. Therefore, the coating layer 8 applied between the projection 25 and the through hole 5 of the base body 7 attaches to only one of either the projection 25 or the base body 7, or cracks occur inside the coating layer 8, thus inhibiting the projection 25 and the base body 7 from becoming firmly stuck together by the coating layer 8. As a result, after cooling, the base body 7 on which the coating layer 8 is provided is easily removed from the projection 25. Further, a case does not arise in which the base body 7 is removed from the holding member 22 in a state in which the projection 25 and the base body 7 are firmly stuck together by the coating layer 8, and a large fragment of the projection 25 attaches to the inner wall surface 5a of the through hole 5 when being forcibly peeled off.

Note that the metal also includes alloys. Further, the projection 25 may include a material other than metal, such as a material whose surface is covered by a protective layer (not illustrated) for inhibiting a change in quality by oxidation or the like. Further, when the holding member 22 is repeatedly used, the coating layer 8 attached to the surface of the projection 25 may be used as the protective layer when using the holding member 22. The protective layer is made from a material with a high thermal resistance that does not change in quality as a result of the film formation step. Specifically, examples of such a material includes TiC, TiN, TiCN, TiAlN, or the like.

Steel, alloy steel, carbon steel, stainless steel, Ti-based metal or molybdenum steel can be suitably used as the metal for the projection 25, and of these, stainless steel and molybdenum steel, which can be easily processed and have a high thermal resistance, are suitable. In addition, with respect to the stainless steel, ferrite-based or martensite-based stainless steel materials, which do not contain nickel, are more suitable, such that abnormal grain growth of the coating layer 8 is not induced when forming the coating layer 8.

The support substrate 24 is not particularly limited, but is required to be made from a material that has a high thermal resistance and does not deform even when exposed to high temperatures. In the present embodiment, the support substrate 24 is formed by graphite, sintered alloy, or ceramic. When the support substrate 24 is made from a material that has a lower thermal expansion coefficient than that of the projection 25, the thermal shrinkage rates of the formed coating layer 8 and the support substrate 24 become closer. When the coating layer 8 is formed on the base body 7, the coating layer 8 is also formed on the support substrate 24. The support substrate 24 expands and contracts due to temperature changes in the film formation step, and the closer the thermal shrinkage rates of the coating layer 8 and the support substrate 24, the more the coating layer 8 follows the thermal expansion of the support substrate 24. As a result, cracks do not occur in the coating layer 8 deposited on the bottom face of the support substrate 24, and the coating layer 8 does not easily peel off from the support substrate 24. When the coating layer 8 has peeled off, the peeled off coating layer 8 sometimes falls below the holding member 22. When the holding members 22 are stacked in many stages, as illustrated in FIG. 3, if another of the base bodies 7 is placed where the coating layer 8 falls, the peeled off pieces of the coating layer 8 become foreign matter. However, in the present embodiment, since the coating layer 8 does not easily peel off from the support substrate 24, this problem is not likely to occur.

In the present embodiment, the thermal expansion coefficient of the projection 25 is from $10 \times 10^{-6}/°$ C. to $17 \times 10^{-6}/°$ C., and the thermal expansion coefficient of the base body 7 is from $4 \times 10^{-6}/°$ C. to $8 \times 10^{-6}/°$ C. Specifically, the thermal expansion coefficient of the projection 25 is greater than the thermal expansion coefficient of the base body 7. In this way, the base body 7 is easily removed after forming the coating layer 8. A suitable range of difference between the thermal expansion coefficient of the base body 7 and the thermal expansion coefficient of the projection 25 is from $4 \times 10^{-6}/°$ C. to $15 \times 10^{-6}/°$ C. Specifically, possible combinations include the following: the projection 25 is stainless steel and the base body 7 is cemented carbide alloy, the projection 25 is molybdenum steel and the base body 7 is cemented carbide alloy, the projection 25 is stainless steel and the base body 7 is cermet, and the projection 25 is stainless steel and the base body 7 is alumina. Note that the thermal expansion coefficient of the support substrate 24 is from $2 \times 10^{-6}/°$ C. to $8 \times 10^{-6}/°$ C. If the thermal expansion coefficient of the support substrate 24 is within this range, a case does not arise in which the support substrate 24 elongates inside the film forming device 20 during the film formation, the position of the base body 7 changes inside the chamber 21, and the state of the coating layer 8 formed on the base body 7 changes.

When the coating layer 8 is formed and the inner wall surface 5a of the through hole 5 of the extracted insert 1 is covered by the coating layer 8, contact traces 9 of the projection 25 are present on the inner wall surface 5a of the through hole 5, as illustrated in FIG. 1B. In the present embodiment, because the projection 25 presses the inner wall surface 5a of the through hole 5 of the base body 7 and deforms during the film formation, this means that metal, which is a component of the projection 25, sometimes attaches to the contact traces 9. Even when the coating layer 8 is not formed on the inner wall surface 5a of the through hole 5, the metal that is the component of the projection 25 may attach to the inner wall surface 5a. In addition, even when the projection 25 with the protective layer on the surface thereof is used, protective layer components are sometimes attached to the inner wall surface 5a, and in some cases, the metal component is further attached to the surface of the protective layer.

The projection 25 has a shape in which the maximum width of the upper portion is less than the maximum width of the lower portion in the cross-section. In other words, the projection 25 has a shape that tapers upward, and, as a more specific shape, the following are included: a cone or a polygonal pyramid shape whose vertical cross-section is a triangular shape; a truncated cone or truncated pyramid (a shape in which only the lower portion is a cone or a polygonal pyramid whose vertical cross-section is a trapezoid: specifically, a shape not having an apex), as illustrated in FIG. 4B; or a shape in which the lower portion is a truncated cone or a truncated pyramid, and the upper portion is a circular column or a polygonal column (a shape in which the lower portion is a truncated cone or a truncated pyramid whose vertical cross-section is a trapezoid, the upper portion is a circular column or a polygonal column whose vertical cross-section is a rectangular shape), as illustrated in FIG. 4C. Note that the transverse cross-section shape of the projection 25 can be polygonal, such as circular, triangular or quadrilateral.

Further, after the film formation, in order to remove the base body 7 more easily from the holding member 22, it is preferable for a contact point between the inner wall surface 5a of the through hole 5 and the projection 25 to be small. Specifically, when the base body 7 is abutted against the projection 25, it is preferable for a section of the projection 25 that is positioned inside the through hole 5 to have an area that is in contact with the base body 7 and an area that is not in contact with the base body 7. From this point of view, in the present embodiment, the external shape of the projection 25 at the position at which the projection 25 is in contact with the inner wall surface 5a of the through hole 5 is a polygonal pyramid shape. Further, in the present embodiment, as illustrated by the cross-sectional views in FIGS. 4B and 4C, the contact between the projection 25 and the inner wall surface 5a of the through hole 5 is point contact and is not surface contact, and the contact points between the projection 25 and the inner wall surface 5a of the through hole 5 are line contacts or point contacts. Note that, from the point of view of easily removing the base body 7, the contact points between the projection 25 and the inner wall surface 5a of the through hole 5 is preferably point contacts rather than line contacts. Further, as illustrated in FIG. 1B, the base body 7 is fixed to the holding member 22 such that the contact traces 9 at which point contact has been made are dotted in several places at predetermined intervals at the same height on the inner wall surface 5a of the through hole 5. In the present embodiment, as illustrated in FIG. 4B, a center portion of the through hole 5 is a circular column and end portions thereof are shaped such that a bore diameter widens toward the outer surface. In this case, the projection 25 is preferably engaged at a boundary between the center portion and the end portion of the through hole 5. According to this method, the contact traces 9 of the insert 1 after the film formation are present at the boundary between the center portion and the end portion of the through hole 5, as illustrated in FIG. 1B.

Next, the interior of the chamber 21 is heated up to a film-forming temperature by the heater 27, while a carrier gas, such as hydrogen gas or argon gas, is fed into the chamber 21 from the gas lead-in pipe 26. At this time, the projection 25 thermally expands, is pressed by the through hole 5 of the base body 7, and deforms. At the same time, a state of close contact is obtained at contact portions between the projection 25 and the inner wall surface 5a of the through hole 5. Note that a gas pressure inside the chamber 21 is adjusted by evacuating the gas through a gas exhaust pipe 28.

Next, film-forming gases are caused to flow inside the chamber 21, and the coating layer 8 is formed on the surface of the base body 7. As an example of specific film formation conditions, as the first layer, a mixed gas made from titanium tetrachloride ($TiCl_4$) gas, nitrogen ($N_2$) gas, and hydrogen ($H_2$) gas is introduced into the chamber 21, and the titanium nitride layer 10 is formed at a film-forming temperature of 800 to 940° C. at from 8 to 50 kPa. As the second layer, a mixed gas made from titanium tetrachloride ($TiCl_4$) gas, nitrogen ($N_2$) gas, acetonitrile gas ($CH_3CN$) gas, and hydrogen ($H_2$) gas is introduced into the chamber 21, and the titanium carbonitride layer 11 is formed at a film-forming temperature of 780 to 880° C. at from 5 to 25 kPa. As the third layer, a mixed gas made from titanium tetrachloride ($TiCl_4$) gas, methane ($CH_4$) gas, nitrogen ($N_2$) gas, carbon monoxide (CO) gas, and hydrogen ($H_2$) gas is introduced into the chamber 21, and the titanium oxycarbonitride layer 12 is formed at a film-forming temperature of 900 to 1050° C. at from 5 to 40 kPa. As the fourth layer, a mixed gas made from aluminum trichloride ($AlCl_3$) gas, hydrogen chloride (HCl) gas, carbon dioxide ($CO_2$) gas, hydrogen sulfide ($H_2S$) gas, and hydrogen ($H_2$) gas is introduced into the chamber 21, and the aluminum oxide layer 13 is formed at a film-forming temperature of 950 to 1100° C. at from 5 to 10 kPa. As fifth layer, a mixed gas made from 0.1 to 10 volume % of titanium tetrachloride ($TiCl_4$) gas, 10 to 60 volume % of nitrogen ($N_2$) gas, and the remainder hydrogen ($H_2$) gas is prepared and introduced into the chamber 21, and the titanium nitride layer 14 is formed at a film-forming temperature of 960 to 1100° C. at from 10 to 85 kPa.

After the film formation is complete, the interior of the chamber 21 is cooled, and the base body 7 and the projection 25 on which the coating layer 8 has been formed are cooled. At this time, the thermal shrinkage rate of the projection 25 is greater than the thermal shrinkage rate of the base body 7, and thus, the contraction of the projection 25 is greater than the contraction of the inner wall surface 5a of the through hole 5 of the base body 7. As a result, after the cooling process, the gap is easily formed between the projection 25 and the inner wall surface 5a of the through hole 5 of the base body 7.

Then, the holding member 22 is removed from inside the chamber 21 of the film forming device 20, and the base body 7 on which the coating layer 8 has been formed is removed from the projection 25 and taken out. In the present embodiment, after the cooling, since the coating layer is formed on one of either the projection 25 or the inner wall surface 5a of the through hole 5 of the base body 7, or since cracks occur in the coating layer 8, the base body 7 is easily removed from the projection 25. As a result, even when the insert 1 is mounted on a holder, the position of the insert 1 is not displaced, and the cutting tool with a high degree of dimension accuracy is obtained.

EXAMPLES

Working Example 1

First, 6 mass % of metal cobalt powder, 0.5 mass % of titanium carbide powder with an average particle size of 2.0 μm, and 5 mass % of niobium carbide powder were added to a remainder of tungsten carbide powder and mixed in that ratio, and then molded by press molding into a tool shape (CNMG120408) including a through hole (with a shape in which a center portion was a circular column and both ends were formed to widen toward the external surface). Then, binder removal treatment was performed, and by firing for one hour at 1500° C. under a vacuum of 0.01 Pa, a base body made from cemented carbide alloy was produced. After that, the produced base body underwent brush processing, and R honing was performed on the portion serving as the cutting edge.

Next, a support substrate made from graphite with the shape illustrated in FIG. 4A, and a holding member made from stainless steel (SUS430: 17 mass % of Cr, less than 1 mass % of a trace component such as Mn, and the remainder Fe) and formed by a projection (a square pyramid with an upper end maximum width of 2.5 mm and a lower end maximum width of 6.0 mm) were prepared. The projection was inserted into the through hole of above-described cemented carbide alloy base body, and the base body was held by being abutted against the projection. This was then transported into a chamber of the chemical vapor deposition (CVD) film forming device illustrated in FIG. 3, and the chamber was sealed.

Then, the interior of the chamber was heated to 900° C., and as the first layer, a mixed gas made from 2.5 volume % of titanium tetrachloride ($TiCl_4$) gas, 23 volume % of nitrogen ($N_2$) gas, and the remainder hydrogen ($H_2$) gas was introduced into the chamber at a gas pressure of 16 kPa, and a titanium nitride layer was formed. As the second layer, the interior of the chamber was set at 850° C., a mixed gas made from 1 volume % of titanium tetrachloride ($TiCl_4$) gas, 10 volume % of nitrogen ($N_2$) gas, 0.2 volume % of acetonitrile ($CH_3CN$) gas, and the remainder hydrogen ($H_2$) gas was introduced into the chamber at a gas pressure of 9 kPa, and a titanium carbonitride layer was formed. As a third layer, the interior of the chamber was set at 1000° C., a mixed gas made from 7 volume % of titanium tetrachloride ($TiCl_4$) gas, 6 volume % of methane ($CH_4$) gas, 5 volume % nitrogen ($N_2$) gas, 0.5 volume % of carbon monoxide (CO) gas, and the remainder hydrogen ($H_2$) gas was introduced into the chamber at a gas pressure of 15 kPa, and a titanium oxycarbonitride layer was formed. As a fourth layer, the interior of the chamber was kept at 1000° C., a mixed gas made from 7 volume % of aluminum trichloride ($AlCl_3$) gas, 0.5 volume % of hydrogen chloride (HCl) gas, 1 volume % of carbon dioxide ($CO_2$) gas, 0.2 volume % of hydrogen sulfide ($H_2S$) gas, and the remainder hydrogen ($H_2$) gas was introduced into the chamber at a gas pressure of 10 kPa, and an aluminum oxide layer was formed. As the fifth layer, the interior of the chamber was set at 1100° C., a mixed gas made from 2 volume % of titanium tetrachloride ($TiCl_4$) gas, 45 volume % of nitrogen ($N_2$) gas, and the remainder hydrogen ($H_2$) gas was introduced into the chamber at a gas pressure of 80 kPa, and a titanium nitride layer was formed.

After the film formation was complete, and after the interior of the chamber was cooled to 200° C. or lower, the holding member was removed and the base body was removed from the projection of the holding member. Of 100 samples, there were no samples in which the projection was broken or the like due to removal in a state in which the projection is adhered to the through hole of the base body, and no samples in which a large enough part of the projection is attached to an inner wall surface of the through hole so as to cause a mounted position of the insert mounted on the holder to become displaced. Further, when the inner wall surface of the through hole was examined using a scanning electron microscope, slight deposits were present, and when the constituent components were analyzed using electron spectroscopic analysis, it was found that Fe and Cr were contained.

Comparative Example

Apart from switching the projection used in Working Example 1 to a projection made of graphite, the same conditions were used as the Working Example, and as a result of forming the coating layer on the base body and removing the insert, of 100 samples, there were a total of 5 samples in which the insert could not be removed due to the broken projection or the like, or in which a large enough part of the projection is attached to an inner wall surface of the through hole so as to cause a mounted position of the insert mounted on the holder to become displaced.

Working Example 2

Apart from switching the projection used in Working Example 1 to a projection made of molybdenum steel with a TiN film of 2 μm formed thereon, the same conditions were used as the Working Example, and as a result of forming the coating layer on the base body and removing the insert, of 100 samples, there were no samples in which the insert could not be removed due to the broken projection or the like, or in which a large enough part of the projection is attached to an inner wall surface of the through hole so as to cause a mounted position of the insert mounted on the holder to become displaced. Further, when the inner wall surface of the through hole was examined using a scanning electron microscope, slight deposits were present, and when the constituent components were analyzed using electron spectroscopic analysis, it was found that Ti, Fe and Cr were contained.

REFERENCE SIGNS LIST

1 Insert
2 Rake face
3 Flank face
4 Cutting edge
5 Through hole
5a Inner wall surface
6 Seating face
7 Base body
8 Coating layer
9 Contact trace
10 Titanium nitride layer
11 Titanium carbonitride layer
12 Titanium oxycarbonitride layer
13 Aluminum oxide layer
14 Titanium nitride layer
20 Film forming device
21 Chamber
22 Holding member
24 Support substrate
25 Projection
26 Gas lead-in pipe
27 Heater
28 Gas exhaust pipe

The invention claimed is:

1. A method for manufacturing a cutting insert, the method comprising:
preparing:
a base body that is formed from a first material and the base body includes a through hole, wherein the first material is one of cermet and ceramic, and
a holding member that includes a projection and the projection is formed from a metal, wherein the metal has a thermal expansion coefficient greater than the first material of the base body and the thermal expansion coefficient of the metal is more than $10 \times 10^{-6}/° C.$;
mounting the base body on the holding member by inserting the projection of the holding member into the through hole of the base body and abutting the base body against the projection;
forming a coated body by forming a coating layer on a surface of the base body; and
cooling the coated body and removing the coated body from the projection.

2. The method according to claim 1, wherein the projection has a polygonal pyramid shape.

3. The method according to claim 1, wherein the holding member comprises a support substrate that comprises one of graphite, cermet, and ceramic.

4. The method according to claim 1, wherein the metal comprises one of steel, alloy steel, carbon steel, stainless steel, and molybdenum steel.

5. A method for manufacturing a cutting insert, the method comprising:
providing a holding member that includes a projection formed from a metal;
inserting the holding member into a through hole of a base body, wherein the base body is made from a first material this is one of cermet and ceramic, and the metal has a thermal expansion coefficient greater than the first material and the thermal expansion coefficient of the metal is more than $10 \times 10^{-6}/° C.$;
abutting the base body against the projection;
forming a coated body by forming a coating layer on the base body; and
removing the coated body from the projection.

6. The method according to claim 5, wherein a maximum width of an upper portion of the projection in a cross-section is less than a maximum width of a lower portion of the projection in the cross-section.

7. The method according to claim 6, wherein the holding member comprises a support substrate and the projection is provided on the support substrate.

8. The method according to claim 6, wherein the base body has a plate shape and the through hole is in a center portion of the base body.

9. The method according to claim 5, wherein the projection has a polygonal pyramid shape.

10. The method according to claim 7, wherein the support substrate is one of graphite, cermet, and ceramic.

11. The method according to claim 5, wherein the metal is one of steel, alloy steel, carbon steel, stainless steel, and molybdenum steel.

12. The method according to claim 5, wherein, when the base body is abutted against the projection, a section of the projection positioned inside the through hole comprises an area that is in contact with the base body and an area that is not in contact with the base body.

13. The method according to claim 5, wherein, when the base body is abutted against the projection, the base body is abutted against the projection in at least one of contact states that are a point contact and a line contact.

14. The method according to claim 5, wherein, when the base body is brought into contact with the projection, the base body is in contact with the metal of the projection.

15. The method according to claim 1, wherein a difference between the thermal expansion coefficient of the metal and the first material is between $4\times10^{-6}/°$ C. to $15\times10^{-6}/°$ C.

16. The method according to claim 5, wherein a difference between the thermal expansion coefficient of the metal and the first material is between $4\times10^{-6}/°$ C. to $15\times10^{-6}/°$ C.

\* \* \* \* \*